(12) United States Patent
Kim

(10) Patent No.: US 7,523,270 B2
(45) Date of Patent: Apr. 21, 2009

(54) MULTI-PORT MEMORY DEVICE

(75) Inventor: Jae-Il Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 398 days.

(21) Appl. No.: 11/529,451

(22) Filed: Sep. 27, 2006

(65) Prior Publication Data
US 2007/0073983 A1 Mar. 29, 2007

(30) Foreign Application Priority Data
Sep. 28, 2005 (KR) .................. 10-2005-0090866
Aug. 23, 2006 (KR) .................. 10-2006-0079677

(51) Int. Cl.
*G06F 13/00* (2006.01)
(52) U.S. Cl. ................ 711/149; 711/168; 711/173; 365/189.04; 365/230.05
(58) Field of Classification Search ............... 711/149, 711/168, 173
See application file for complete search history.

(56) References Cited

U.S. PATENT DOCUMENTS 5,027,326 A * 6/1991 Jones ................... 365/221
6,757,854 B1 * 6/2004 Zhao et al. ............. 714/719
7,120,761 B2 * 10/2006 Matsuzaki et al. ......... 711/149
2005/0125594 A1 6/2005 Mattausch et al.

FOREIGN PATENT DOCUMENTS

JP 8-221319 8/1996

* cited by examiner

*Primary Examiner*—Reba I Elmore
(74) *Attorney, Agent, or Firm*—Blakely, Sokoloff, Taylor & Zafman LLP

(57) ABSTRACT

A multi-port memory device has a plurality of ports which are connected to different external devices with the memory device performing serial data communication independently. The memory device has a plurality of banks, each of which has a plurality of cell arrays. The memory device also has a write counter for increasing the counting number whenever write data are applied to the banks through the ports and a write data register for temporarily storing the write data according to the count number. A write flag signal generator generates a flag signal for writing the temporarily stored data to the banks. The memory device also has a write enable signal generator for generating a write enable signal is response to the flag signal to write the temporarily stored write data to the banks.

23 Claims, 11 Drawing Sheets

MULTI-PORT MEMORY DEVICE

FIELD OF THE INVENTION

The present invention relates to a semiconductor device, and more particularly, to a multi-port memory device.

DESCRIPTION OF RELATED ART

Dynamic random access memory (DRAM) has been used in desktop computer, notebook computer, server system, and audio/video system such as HDTV. The application range of DRAM is being expanded. Accordingly, the memory device requires a new input/output (I/O) interface scheme, instead of a data exchange scheme using a plurality of I/O pins at a single port, that is, a parallel I/O interface scheme.

FIG. 1 is a block diagram of a conventional single-port memory device. In FIG. 1, an x16 512M DRAM having an 8-bank structure is illustrated.

The conventional single-port memory device (x16 512M DRAM) includes first to eighth banks BANK0 to BANK7, each having n×m memory cells arranged in a matrix form, a port for performing a single communication with the first to eighth banks BANK0 to BANK7, and a plurality of data lines GIO for transferring signals between the port and pins and between the port and the first to eighth banks BANK0 to BANK7. The data lines GIO mean global I/O lines and includes control buses, 15 address buses, and 16 data buses.

Because such a memory device uses a single port, various multimedia functions cannot be implemented. To implement the multimedia functions in the single-port memory device, a plurality of memory devices (e.g., DRAMs) are independently configured such that the respective memory devices can manage different functions. In this case, however, it is difficult to properly allocate memory resource to a device having a large amount of memory access and a device having a small amount of memory access. Consequently, utilization efficiency with respect to density of the memory device is reduced.

SUMMARY OF THE INVENTION

It is, therefore, an object of the present invention to provide a multi-port memory device that can support a normal write operation, a "write burst with preemption" operation, and an interrupt write operation.

In accordance with an aspect of the present invention, there is provided a multi-port memory device having a plurality of ports which are connected to different external devices and perform a serial data communication independently, and a plurality of banks each having a plurality of cell arrays, the multi-port memory device including: a write counter for increasing a counting number whenever write data are applied to the banks through the ports; a write data register for temporarily storing the write data according to the count number; a write flag signal generator for generating a flag signal for writing the temporarily stored write data to the banks; and a write enable signal generator for generating a write enable signal in response to the flag signal to write the temporarily stored write data to the banks.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A multi-port memory device in accordance with exemplary embodiments of the present invention will be described in detail with reference to the accompanying drawings.

Figure 1:
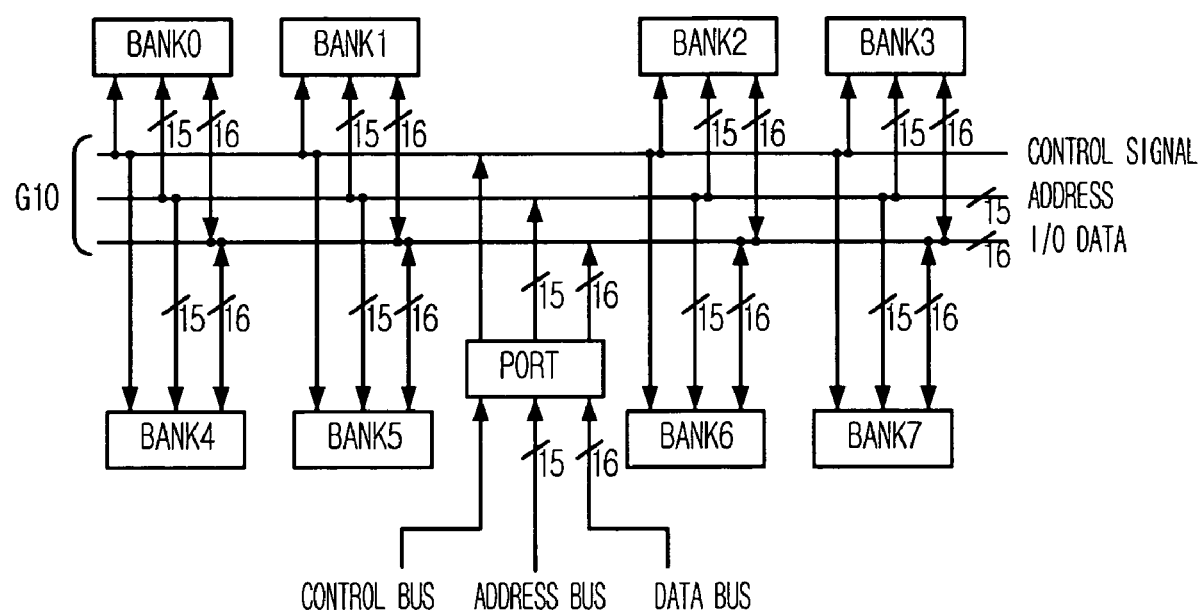
FIG. 1 is a block diagram of a conventional single-port memory device.
Figure 2:
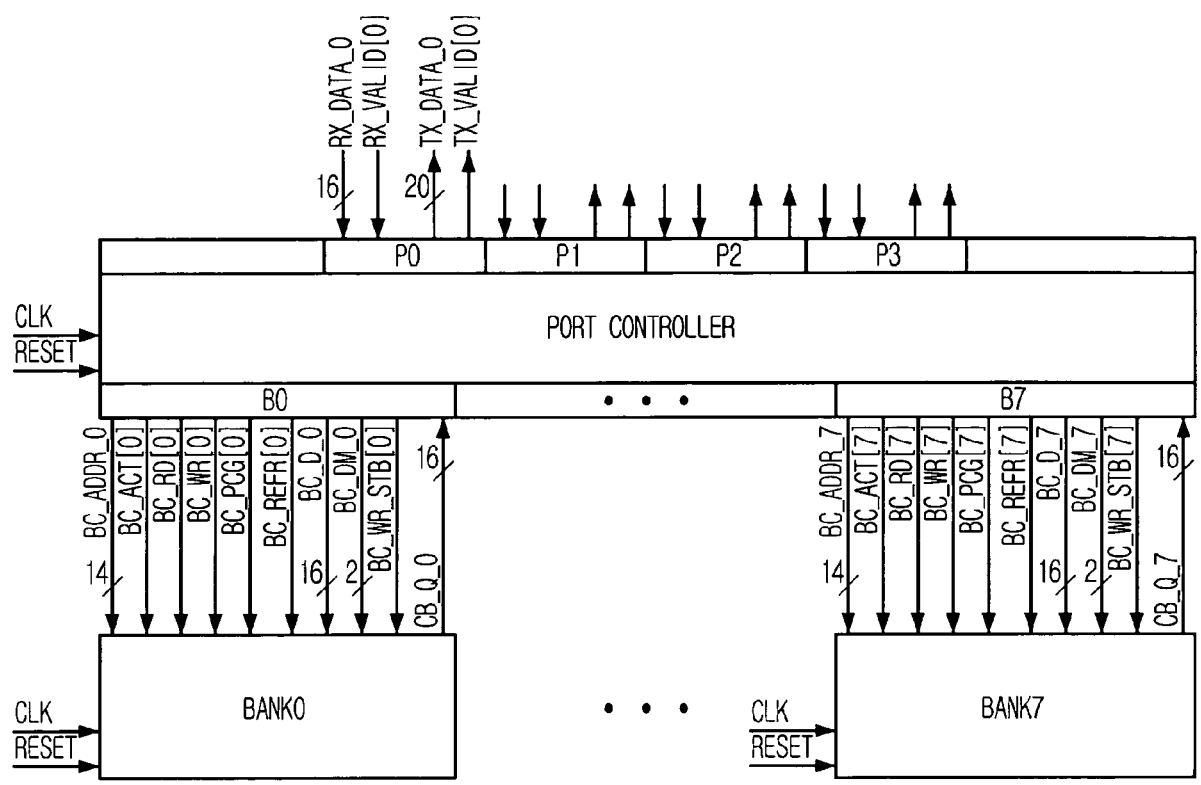
FIG. 2 is a block diagram of a multi-port memory device Fin accordance with an embodiment of the present invention.

FIG. 2 is a block diagram of a multi-port memory device in accordance with an embodiment of the present invention.

The multi-port memory device includes a port controller and transmission lines. The port controller includes four ports P0 to P3 for performing a serial data communication independently of other external devices, eight banks BANK0 to BANK7 each having a plurality of memory cells, and bank controllers B0 to B7 provided to correspond to the banks BANK0 to BANK7 and controlling the ports P0 to P3. The transmission lines for performing a parallel data transmission with the bank controllers B0 to B7 mean buses for transferring address signals, data signals, and control signals.

More specifically, the ports P0 to P3 include a receiving unit for receiving reception data RX_DATA_0 and RX_VALID[0], and a transmitting unit for transmitting transmission data TX_DATA_0 and TX_VALID[0]. The reception and transmission operations are performed in series.

The port controller are connected to data lines such that it can independently access all the banks BANK0 to BANK7, that is, the banks BANK0 to BANK7 can perform the independent operation of an existing DRAM. At this point, the port controller further includes the bank controllers B0 to B7 corresponding to the banks BANK0 to BANK7. The bank controllers B0 to B7 and the banks BANK0 to BANK7 transmit and receive data in parallel.

In this case, data lines (buses) are required. Signals and data transferred to the data lines will be described in detail.

Signals BC_ADDR<0:13> are column address signals of the banks BANK0 to BANK7 to which the signals are inputted. Signals BC_ACT, BC_RD, BC_WR, BC_PCG and BC_REFR are an active command, a read command, a write command, a precharge command, and a refresh command, respectively. Signals BC_D<0:15> are write data, and signals BC_DM<0:1> are write data mask signals for controlling the transmission of the write data BC_D<0:15>. Signals BC_WR_STB are write data input flag signals that are set to logic level HIGH when the write data BC_D<0:15> are applied. Signals CB_Q<0:15> are read data.

Figure 3A:
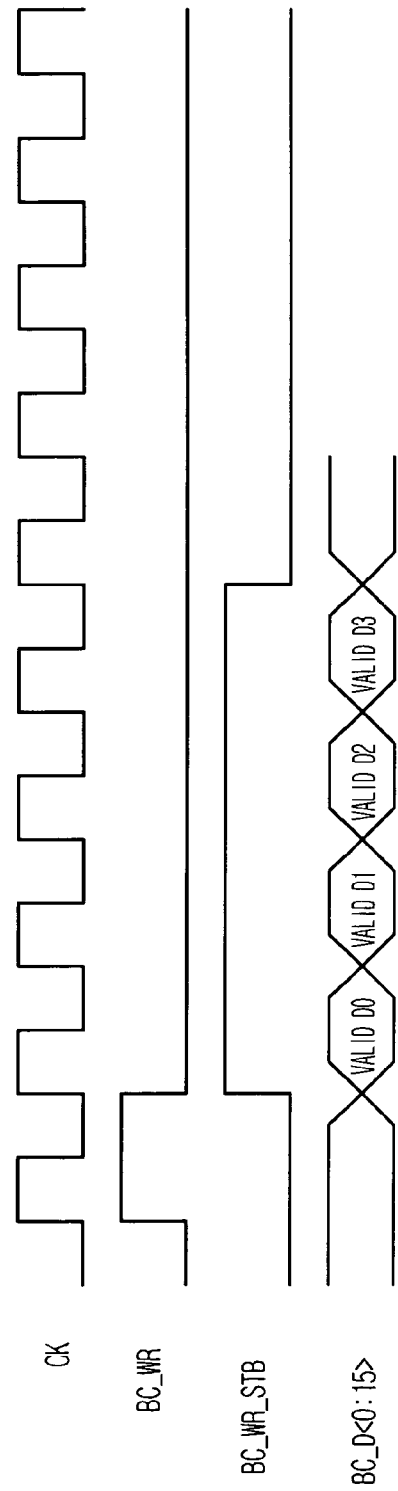
FIGS. 3A to 3C are timing diagrams of a write operation in the multi-port memory device of FIG. 2.
Figure 3B:
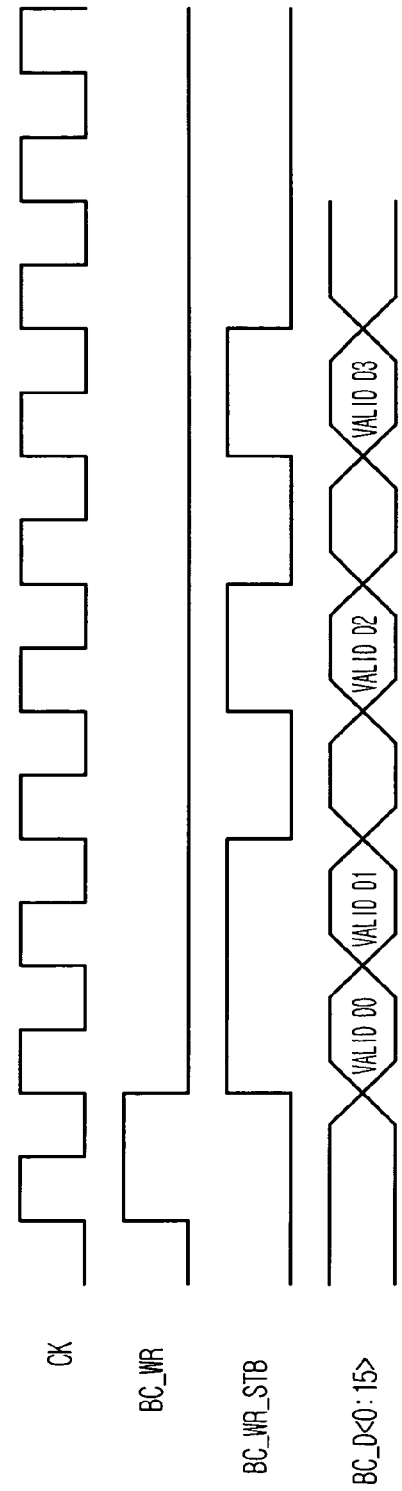
Figure 3C:
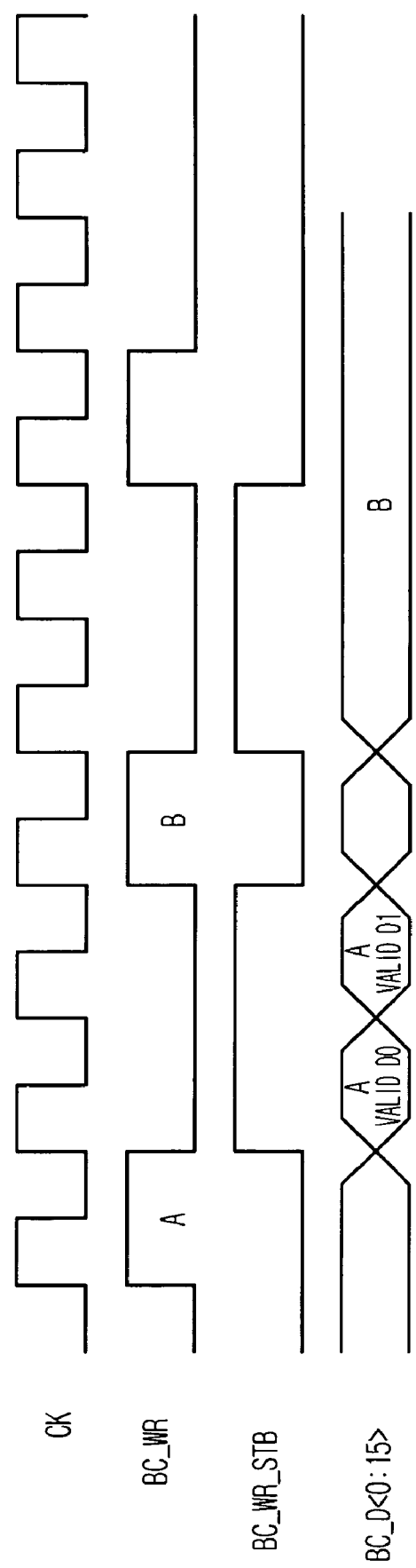

FIGS. 3A to 3C are timing diagrams illustrating the write operation of the multi-port memory device of FIG. 2.

Specifically, FIG. 3A is a timing diagram of a normal write operation, FIG. 3B is a timing diagram of a "write burst with preemption" operation, and FIG. 3B is a timing diagram of an interrupt write operation.

Referring to FIG. 3A, during the normal write operation, when the write command BC_WR is inputted in synchronization with clock CK, 16-bit write data BC_D<0:15> is applied in each clock for four clocks CK in response to the write command BC_WR. While the write data BC_D<0:15> is applied, the write data input flag signal BC_WR_STB has to maintain logic level HIGH.

That is, during the normal write operation, the 16-bit write data BC_D<0:15> are transferred from the ports P0 to P3 to the banks BANK0 to BANK7 in each clock for four clocks.

Referring to FIG. 3B, during the "write burst with preemption" operation, when the write command BC_WR is inputted in synchronization with the clock CK, the write data BC_D<0:15> are not sequentially inputted by 16 bits in response to the write command BC_WR, "no operation" (NOP) is inputted between the write data BC_D<0:15> applied by 16 bits. At this point, while the write data BC_D<0:15> are applied, the write data input flag signal BC_WR_STB has to maintain logic level HIGH and the write data BC_D<0:15> are applied for four clocks CK.

That is, the "write burst with preemption" operation supports a normal write operation even when NOP is inputted while the write data BC_D<0:15> are applied.

Referring to FIG. 3C, during the interrupt write operation, when the write command BC_WR (region A) is inputted in synchronization with the clock CK, another command (except for the write command, region B) is inputted while the 16-bit write data BC_D<0:15> is applied in response to the write command BC_WR, so that the write operation (region A) is interrupted. After the activation of another command is finished, the write operation is again performed to transfer a total of 64 bits of the write data BC_D<0:15>.

That is, the interrupt write operation supports a normal write operation even when another command is inputted while the write data BC_D<0:15> are applied.

Figure 4:
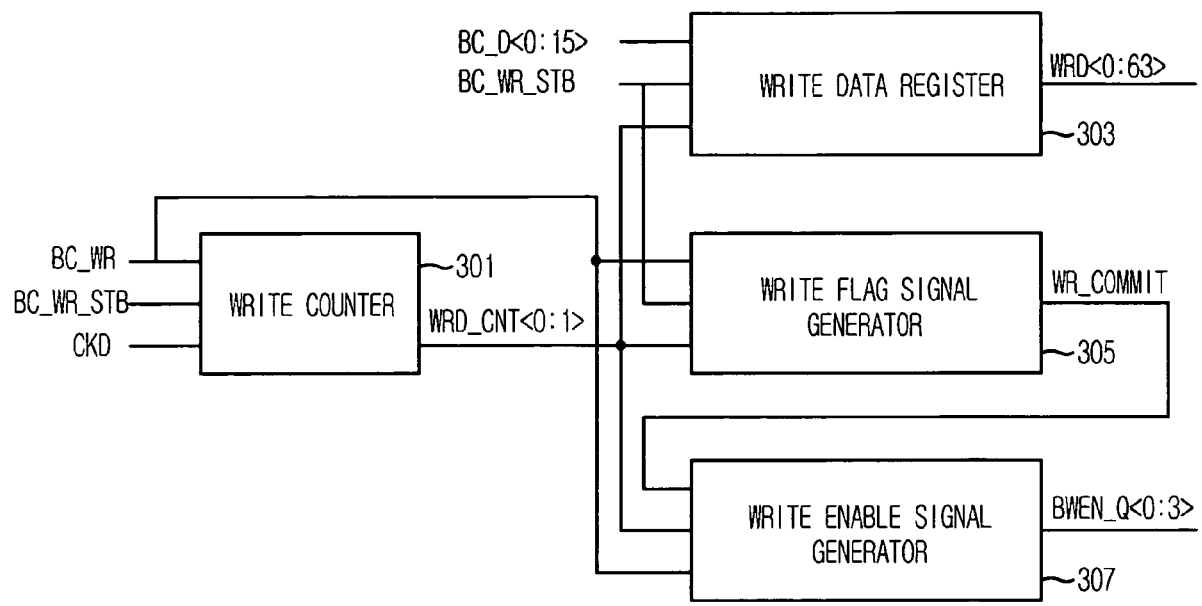
FIG. 4 is a block diagram of a write circuit in the multi-port memory device supporting the write operation of FIGS. 3A to 3C.

FIG. 4 is a block diagram of a write circuit of the multi-port memory device supporting the write operation of FIGS. 3A to 3C.

The write circuit includes a write counter 301, a 64-bit write data register 303, a write flag signal generator 305, and a write enable signal generator 307. The write counter 301 counts down from "3" to "0" whenever the write data BC_D<0:15> are inputted. The 64-bit write data register 303 collects the write data BC_D<0:15> inputted by 16 bits for four clocks CK, and writes the inputted write data BC_D<0:15> to the memory cells 64 bits at a time. The write flag signal generator 305 generates a signal for writing the temporarily stored write data BC_D<0:15> to the banks BANK0 to BANK7. The write enable signal generator 307 generates a signal for writing the write data BC_D<0:15> to the banks BANK0 to BANK7 divided in four quarters.

The respective parts of the write circuit will be described below in more detail.

Figure 5:
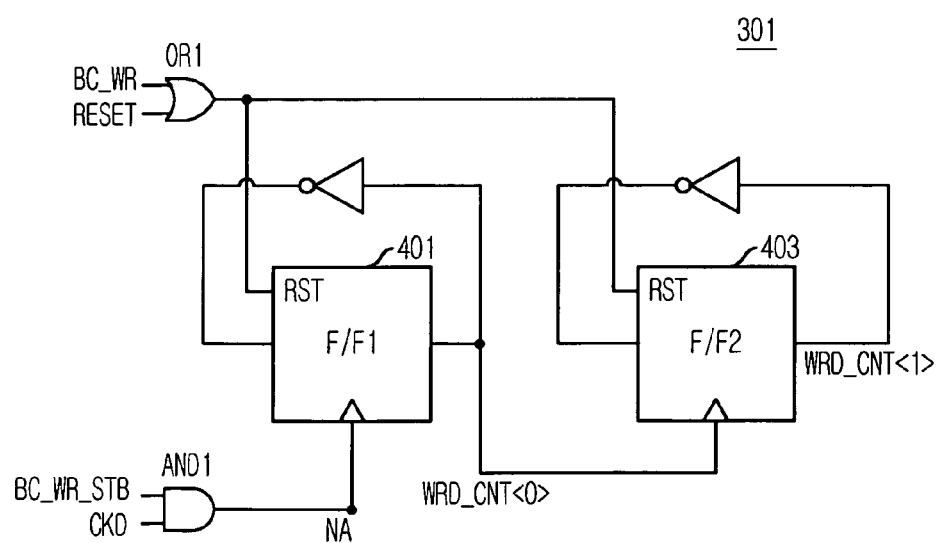
FIG. 5 is a circuit diagram of a write counter of FIG. 4.

FIG. 5 is a circuit diagram of the write counter 301.

The write counter 301 is a 2-bit counting circuit that operates only while the write data input flag signal BC_WR_STB is logic level HIGH. The write counter 301 includes a first toggle flip-flop 401 for dividing its own control signal by two, a second toggle flip-flop 403 for dividing an output signal of the first toggle flip-flop 401 by two, a first AND gate AND1 for controlling the first toggle flip-flop 401, and an OR gate OR1 for resetting the first toggle flip-flop 401 and the second toggle flip-flop 403.

The first AND gate AND1 receives the write data input flag signal BC_WR_STB and a delayed clock CKD generated by delaying the clock CK by a predetermined time, and the first OR gate OR1 receives the write command BC_WR and the reset signal RESET.

When the write command signal BC_WR or the reset signal RESET is inputted to the write counter 301, it serves as the reset signal of the first toggle flip-flop 401, so that the count value of the write counter 301 is reset to "0". Then, a combination of the write data input flag signal BC_WR_STB and the delayed clock CKD is used as a control signal of the first toggle flip-flop 401 generating a first bit WRD_CNT<0> of the write counter 301. The first divided signal WRD_CNT<0> outputted from the first toggle flip-flop 401 is used as a control signal of the second toggle flip-flop 403 generating a second bit WRD_CNT<1> of the write counter 301. Consequently, whenever the write data are inputted, the write counter 301 reset by the write command signal BC_WR or the reset signal RESET counts down from "3" to "0". The delayed clock CKD prevents glitch from being generated at an NA node immediately when the write data input flag signal BC_WR_STB changes from logic level HIGH to logic level LOW.

Figure 6A:
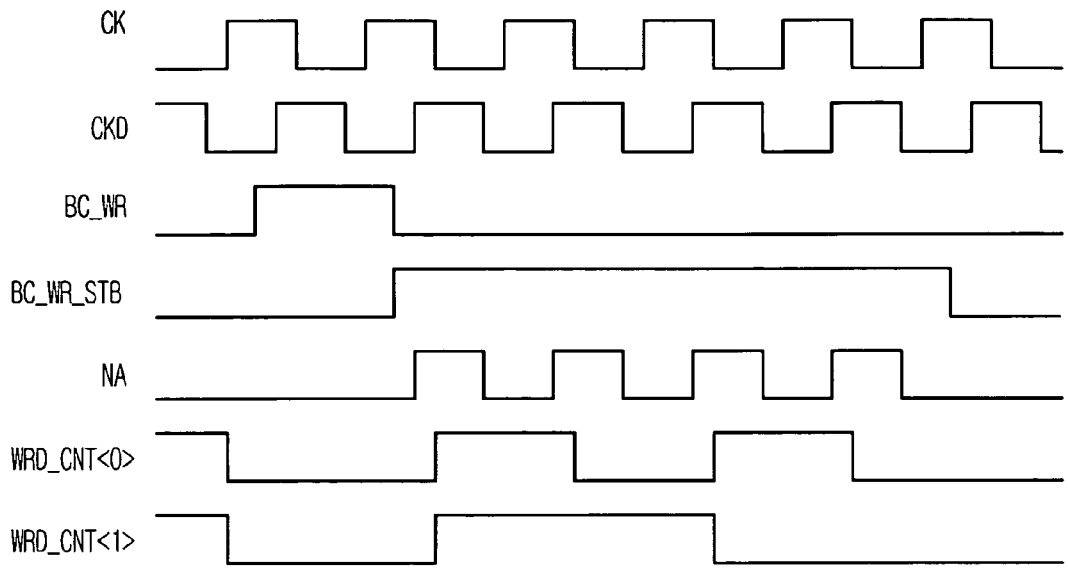
FIGS. 6A and 6B are timing diagrams showing an operation of the write counter of FIGS. 6A and 6B.
Figure 6B:
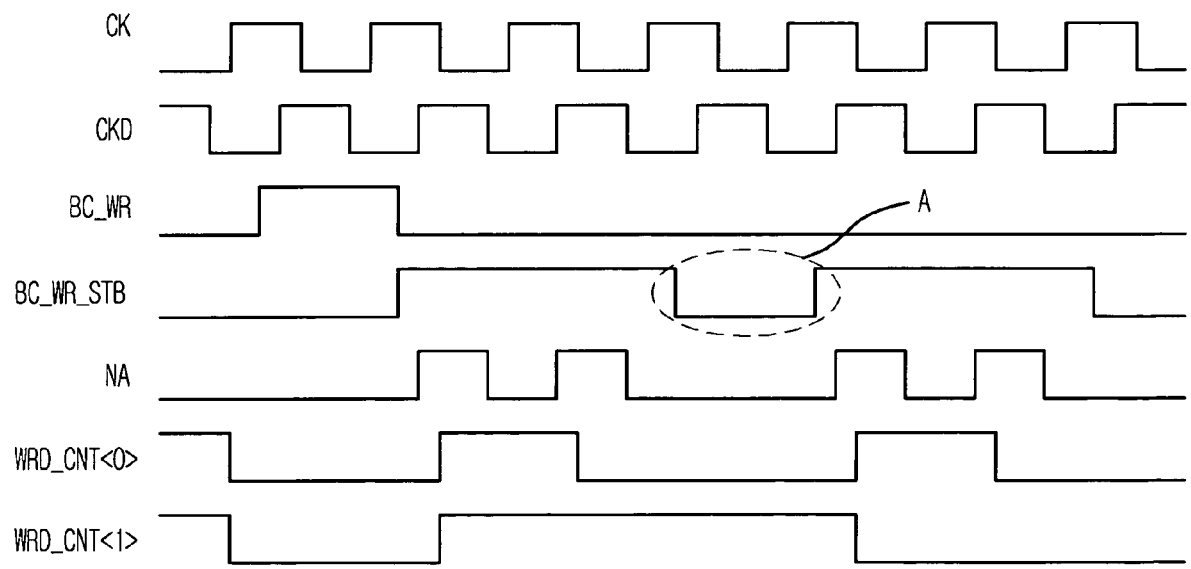

FIGS. 6A and 6B are timing diagrams of the write counter of FIG. 4.

FIG. 6A is a timing diagram of the normal write operation of the write counter. Referring to FIG. 6A, the write command BC_WR is inputted to the write counter 301 and the write data input flag signal BC_WR_STB is activated. The write data input flag signal BC_WR_STB has an active period during which four pairs of the 16-bit write data are inputted in synchronization with a falling edge of the write command BC_WR. A signal of the node NA (hereinafter, referred to as an NA signal) is toggled at constant widths within the active period of the write data input flag signal BC_WR_STB.

The first toggle flip-flop using the NA signal as its own control signal divides the NA signal by two to output the first divided signal WRD_CNT<0>, and the second toggle flip-flop using the first divided signal WRD_CNT<0> as its own control signal divides the first divided signal WRD_CNT<0> by two to output the second divided signal WRD_CNT<1>.

The write counter 301 has the count value of "3", "2", "1" and "0" at the falling and rising edges of the first divided signal WRD_CNT<0>.

FIG. 6B is a timing diagram of the "write burst with preemption" operation of the write counter. Referring to FIG. 6B, the write command BC_WR is inputted to the write counter 301 and the write data input flag signal BC_WR_STB is activated. The write data input flag signal BC_WR_STB has an active period during which four pairs of the 16-bit write data are inputted in synchronization with the falling edge of the write command BC_WR. At this point, when NOP is inputted while some of the four pairs of the write data are being inputted, an inactive period A is generated in the write data input flag signal BC_WR_STB.

When the write data input flag signal BC_WR_STB is deactivated, the NA signal toggling for applying the write data is deactivated. That is, the memory device stops transferring the write data and waits for the re-activation of the write data input flag signal BC_WR_STB.

The first toggle flip-flop using the NA signal as its own control signal divides the NA signal by two to output the first divided signal WRD_CNT<0>, and the second toggle flip-flop using the first divided signal WRD_CNT<0> as its own control signal divides the first divided signal WRD_CND<0> by two to output the second divided signal WRD_CNT<1>.

The write counter 301 has the count value of "3", "2", "1" and "0" at the falling and rising edges of the first divided signal WRD_CNT<0>.

The write data are inputted by 16 bits for four clocks after the write command is inputted. Therefore, a 64-bit register is required to write the inputted write data to the memory cells 64 bits at a time.

Figure 7:
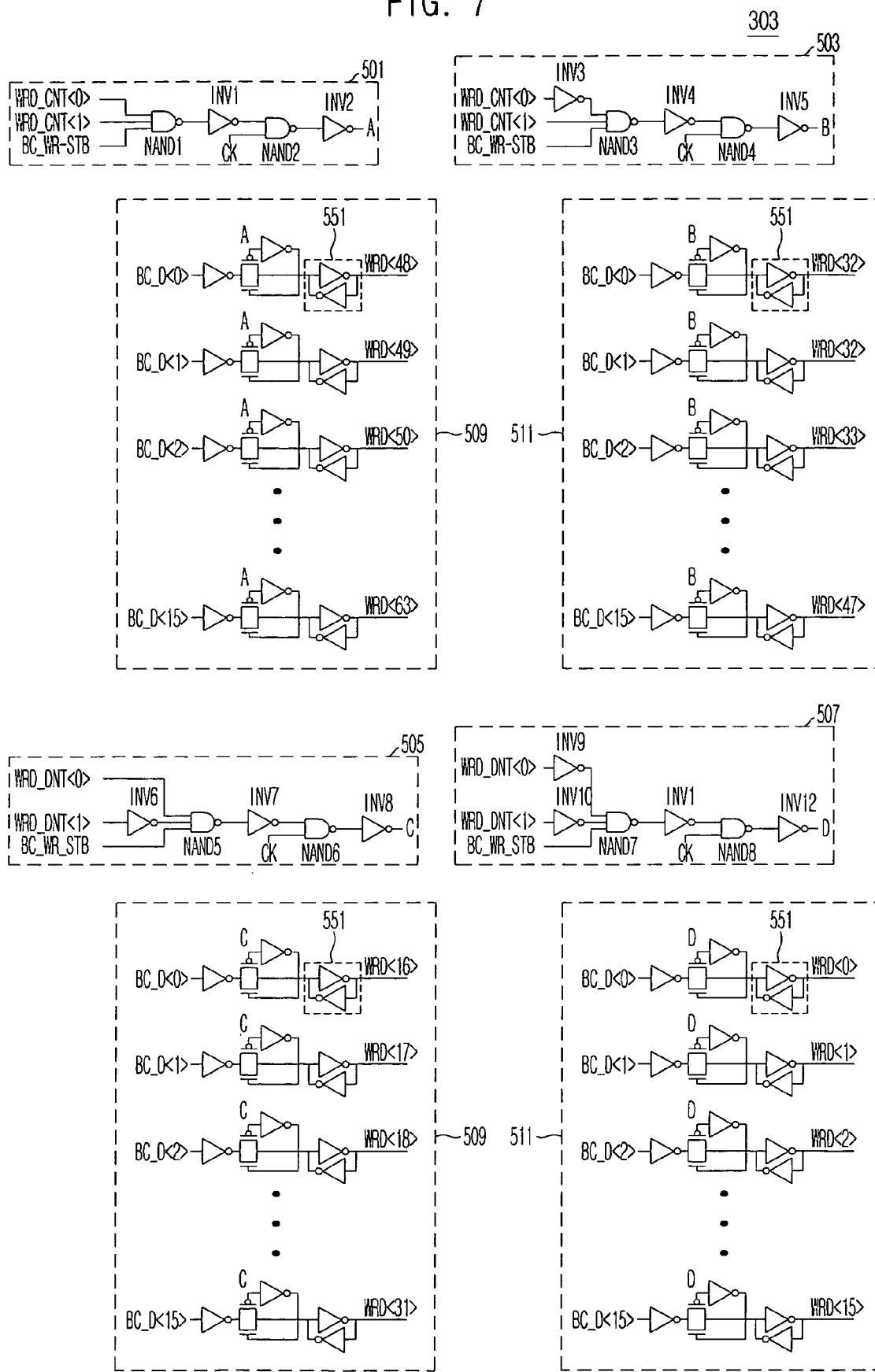
FIG. 7 is a circuit diagram of a write data register of FIG. 4.

FIG. 7 is a circuit diagram of the write data register 303 of FIG. 4.

The write data register 303 includes first to fourth registers 509, 511, 513 and 515 and first to fourth decoders 501, 503, 505 and 507 for controlling the operations of the first to fourth registers 509, 511, 513 and 515.

The first decoder 501 includes a first NAND gate NAND1, a first inverter INV1, a second NAND gate NAND2, and a second inverter INV2. The first NAND gate NAND1 is configured to receive the first divided signal WRD_CNT<0>, the second divided signal WRD_CNT<1>, and the write data input flag signal BC_WR_STB, and the first inverter INV1 inverts an output signal of the first NAND gate NAND1. The second NAND gate NAND2 is configured to receive an output signal of the first inverter INV1 and the clock CK, and the second inverter INV2 inverts an output signal of the second NAND gate NAND2 to output a first decoding signal A.

The second decoder 503 includes a third inverter INV3, a third NAND gate NAND3, a fourth inverter INV4, a fourth NAND gate NAND4, and a fifth inverter INV5. The third inverter INV3 inverts the first divided signal WRD_CNT<0>, and the third NAND gate NAND3 is configured to receive an output signal of the third inverter INV3, the second divided signal WRD_CNT<1>, and the write data input flag signal BC_WR_STB. The fourth inverter INV4 inverts an output signal of the third NAND gate NAND3, and the fourth NAND gate NAND4 is configured to receive an output signal of the fourth inverter INV4 and the clock CK. The fifth inverter INV5 inverts an output signal of the fourth NAND gate NAND4 to output a second decoding signal B.

The third decoder 505 includes a sixth inverter INV6, a fifth NAND gate NAND5, a seventh inverter INV7, a sixth NAND gate NAND6, and an eighth inverter INV8. The sixth inverter INV6 inverts the second divided signal WRD_CNT<1>, and the fifth NAND gate NAND5 is configured to receive an output signal of the sixth inverter INV6, the first divided signal WRD_CNT<0>, and the write data input flag signal BC_WR_STB. The seventh inverter INV7 inverts an output signal of the fifth NAND gate NAND5, and the sixth NAND gate NAND6 is configured to receive an output signal of the seventh inverter INV7 and the clock CK. The eighth inverter INV8 inverts an output signal of the sixth NAND gate NAND6 to output a third decoding signal C.

The fourth decoder 507 includes a ninth inverter INV9, a tenth inverter INV10, a seventh NAND gate NAND7, an eleventh inverter INV11, an eighth NAND gate NAND8, and a twelfth inverter INV12. The ninth inverter INV9 and the tenth inverter INV10 invert the first divided signal WRD_CNT<0> and the second divided signal WRD_CNT<1>, respectively. The seventh NAND gate NAND7 is configured to receive an output signal of the ninth inverter INV9, an output signal of the tenth inverter INV10, and the write data input flag signal BC_WR_STB. The eleventh inverter INV11 inverts an output signal of the seventh NAND gate NAND7, and the eighth NAND gate NAND8 is configured to receive an output signal of the eleventh inverter INV11 and the clock CK. The twelfth inverter INV12 inverts an output signal of the eighth NAND gate NAND8 to output a fourth decoding signal D.

The first register 509 includes 16 latch circuits and 16 transmission gates for temporarily storing the 16-bit write data BC_D<0:15>. For example, the register for temporarily storing the write data BC_D<0> includes the first transmission gate for transferring the write data BC_D<0> to the first latch circuit 551 in response to the first decoding signal A outputted from the first decoder 501.

The second to fourth registers 511, 513 and 515 are implemented with the same structure as the first register 509 and are controlled by the second to fourth decoding signals B, C and D, respectively.

Consequently, 64-bit write data are stored in the registers 509, 511, 513 and 515 selected by the divided signals WRD_CNT<0:1> and the write data input flag signal BC_WR_STB, which are inputted to the first to fourth decoders 501, 503, 505 and 507.

At this point, a write flag signal is required to indicate whether to perform the write operation on the write data that are temporarily stored in the registers 509, 511, 513 and 515.

Figure 8:
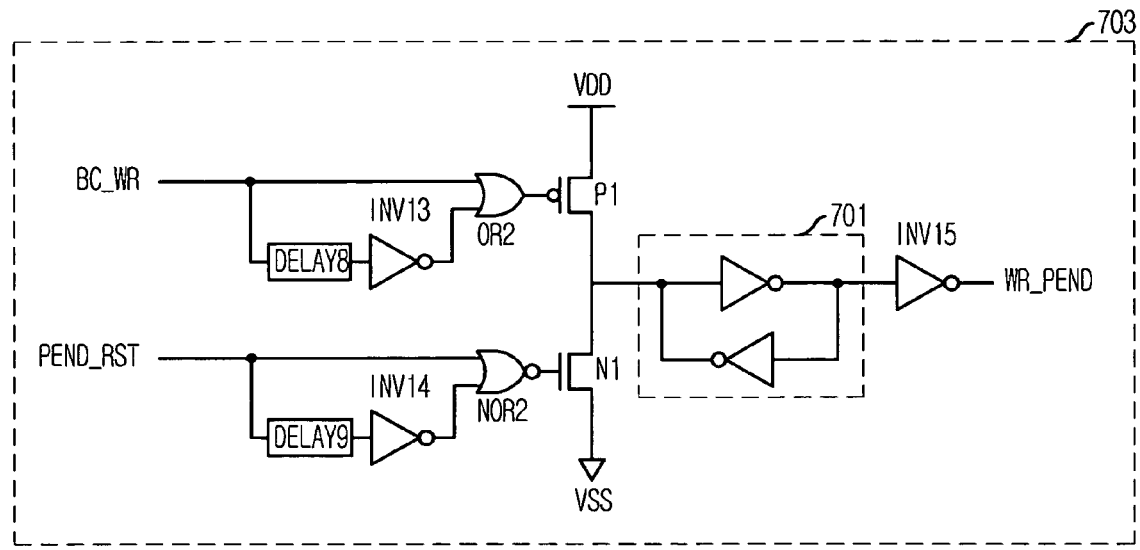
FIG. 8 is a circuit diagram of a write flag signal generator of FIG. 4.
Figure 8:
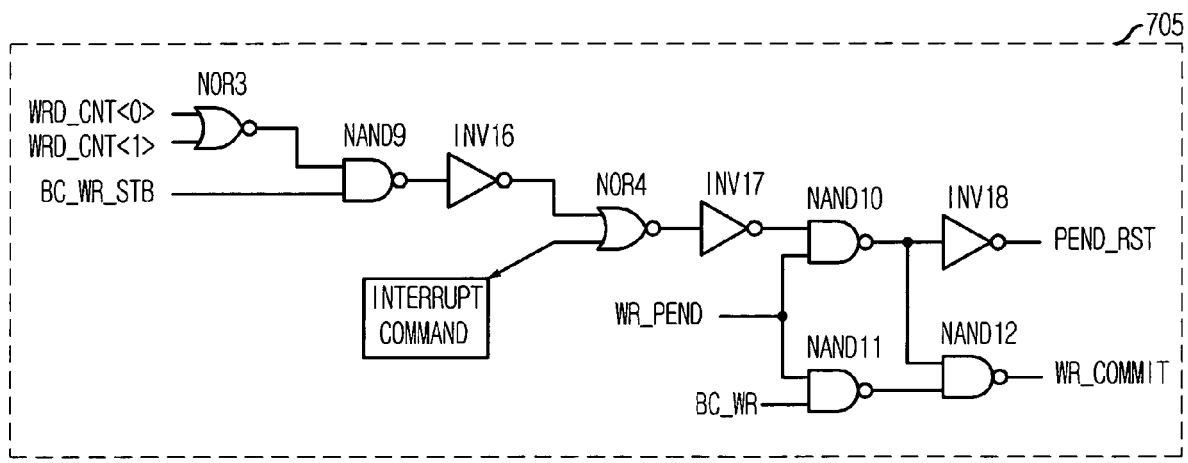

FIG. 8 is a circuit diagram of the write flag signal generator 305.

The write flag signal generator 305 includes a write operation control circuit 703 and a write flag signal generating circuit 705. The write operation control circuit 703 generates a write operation control signal WR_PEND to control the write flag signal WR_COMMIT. The write flag signal generating circuit 705 generates the write flag signal WR_COMMIT to generate a write driver enable signal BWEN and a driving signal of a YI transistor (a transistor for connecting a bit line to a segment I/O line).

More specifically, in the write operation control circuit 703, a first delay DELAY8 delays the write command BC_WR, and a first inverter INV13 inverts an output signal of the first delay DELAY8. An OR gate OR2 is configured to receive an output signal of the first inverter INV13 and the write command BC_WR. A PMOS transistor P1 is connected to a power supply voltage VDD and has a gate receiving an output signal of the OR gate OR2. A second delay DELAY9 delays a write operation control reset signal PEND_RST, and a second inverter INV14 inverts an output signal of the second delay DELAY9. A first NOR gate NOR2 is configured to receive an output signal of the second inverter INV14 and the write operation control reset signal PEND_RST. A first NMOS transistor N1 is connected to a ground voltage VSS and has a gate receiving an output signal of the first NOR gate NOR2. A latch circuit 701 latches an output signal of the first PMOS transistor P1 and the first NMOS transistor N1. A third inverter INV15 inverts an output signal of the latch circuit 701 to output the write operation control signal WR_PEND activated during a write data input period and an active period of the write flag signal.

In the write flag signal generating circuit 705, a second NOR gate NOR3 is configured to receive the first divided signal WRD_CNT<0> and the second divided signal WRD_CNT<1>, and a first NAND gate NAND9 is configured to receive an output signal of the second NOR gate NOR3 and the write data input flag signal BC_WR_STB. A fourth inverter INV16 inverts an output signal of the first NAND gate NAND9. A third NOR gate NOR4 is configured to receive an output signal of the fourth inverter INV16 and the interrupt command. A fifth inverter INV17 inverts an output signal of the third NOR gate NOR4. A second NAND gate NAND10 is configured to receive an output signal of the fifth inverter INV17 and the write operation control signal WR_PEND outputted from the write operation control circuit 703. An sixth inverter INV18 inverts an output signal of the second NAND gate NAND10 to output the write operation control reset signal PEND_RST deactivating the write operation control signal WR_PEND. A third NAND gate NAND11 is configured to receive the write operation control signal WR_PEND and the write command BC_WR, and a fourth NAND gate NAND12 is configured to receives an output signal of the third NAND gate NAND11 and the output signal of the second NAND gate NAND10 to output the write flag signal WR_COMMIT.

Figure 9A:
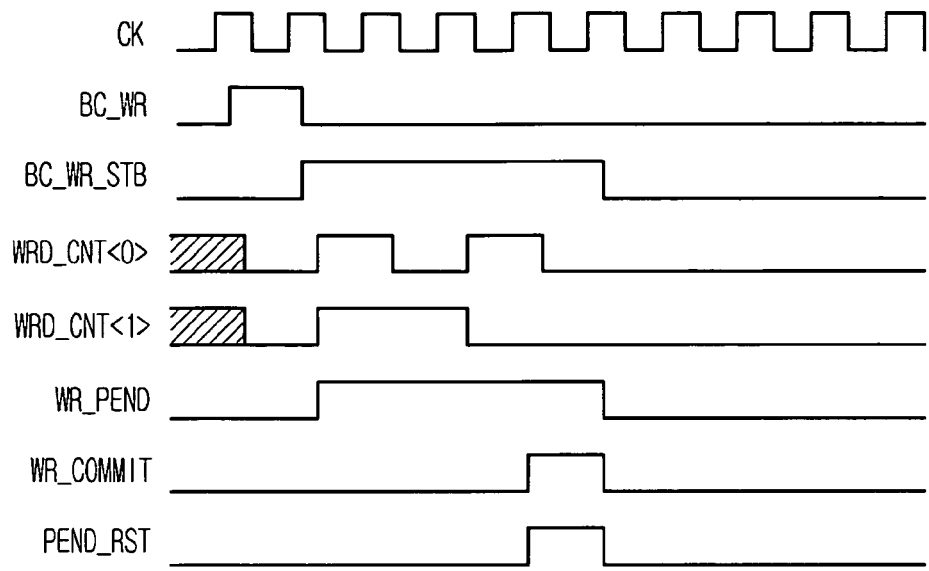
FIGS. 9A and 9B are timing diagrams showing an operation of the write flag signal generator of FIG. 8.
Figure 9B:
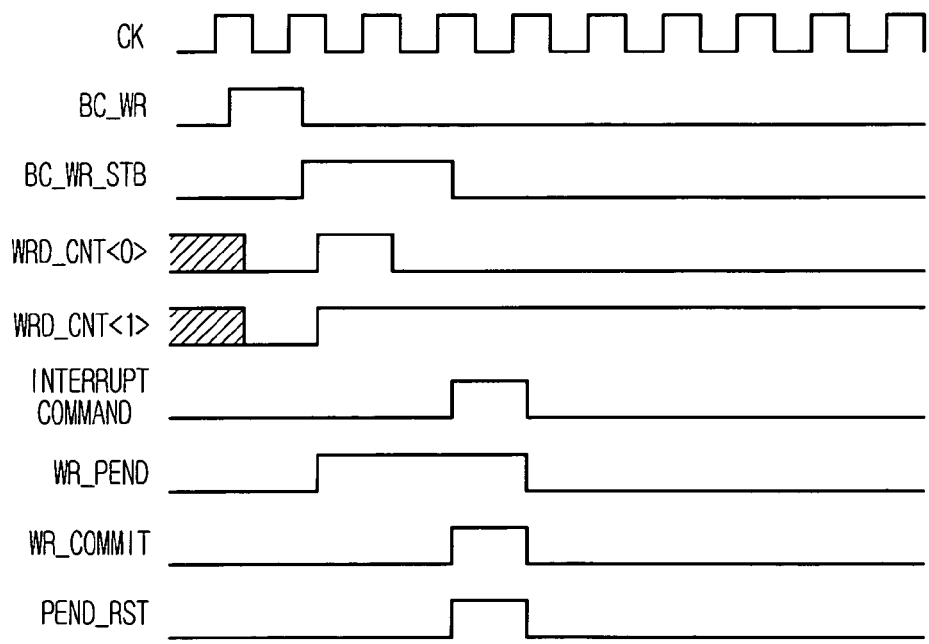

FIGS. 9A and 9B are timing diagrams showing an operation of the write flag signal generator of FIG. 8.

FIG. 9A is a timing diagram of the normal write operation. Referring to FIG. 9A, the write data are applied to the write data register in response to the first divided signal WRD_CNT<0>, the second divided signal WRD_CNT<1>, and the write data input flag signal BC_WR_STB. When all the 64-bit write data are applied, the write data flag signal WR_COMMIT is activated by a combination of the first divided signal WRD_CNT<0>, the second divided signal WRD_CNT<1>, and the write data input flag signal BC_WR_STB. Accordingly, the write driver enable signal BWEN and the driving signal of the YI transistor are generated. Simultaneously, the write operation control reset signal PEND_RST is activated and the write operation control signal WR_PEND is deactivated. The write flag signal WR_COMMIT is also deactivated.

FIG. 9B is a timing diagram of the interrupt write operation. Referring to FIG. 9B, the first divided signal WRD_CNT<0>, the second divided signal WRD_CNT<1>, and the write data input flag signal BC_WR_STB are deactivated by the interrupt command. To write the applied write data to the memory cells, the write flag signal is activated. In addition, the write operation control reset signal PEND_RST is activated and the write operation control signal WR_PEND is deactivated. The write flag signal WR_COMMIT is deactivated.

When the interrupt command is inputted in such a state that the write data are not all applied, the write data applied till that time have to be written to the memory cells. However, when the write flag signal WR_COMMIT is generated by the interrupt command, some of the 64-bit write data are stored in the write data register and written to the memory cells, if a control circuit is not provided. For example, when 32-bit write data are applied to the write data register and the write flag signal WR_COMMIT is activated by the interrupt command, the 64-bit write data are considered as being written to the memory cells, regardless of applying the remaining 32-bit write data to the write data register. This causes an erroneous operation of the multi-port memory device.

To solve this problem, the count value when the write flag signal WR_COMMIT is generated is stored, and the stored count value is used when the write driver enable signal BWEN is generated.

Figure 10:
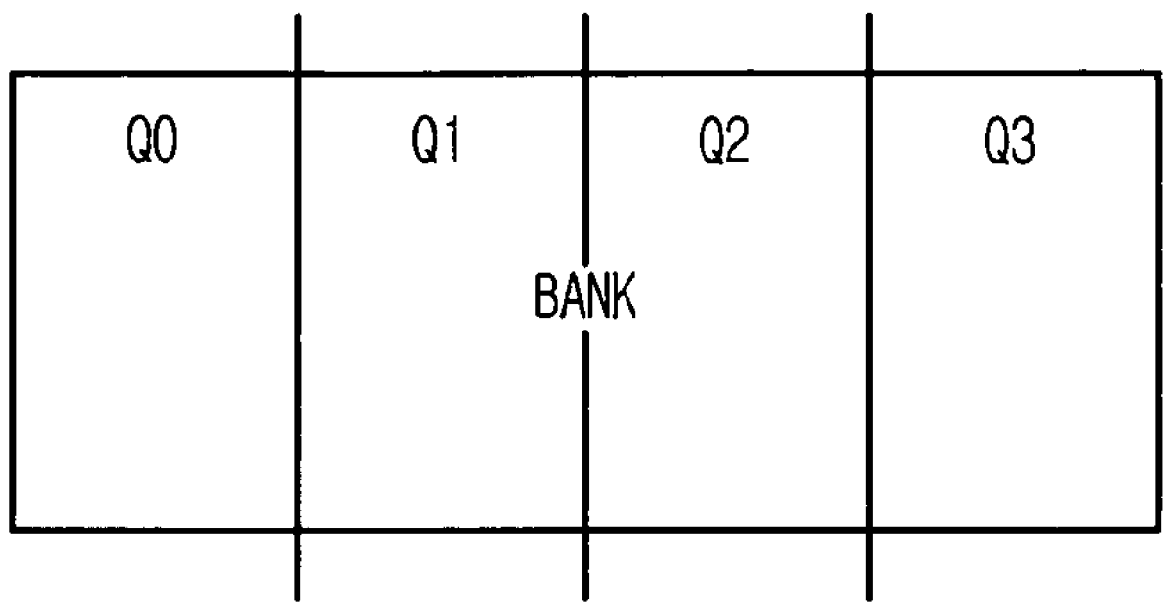
FIG. 10 is a block diagram of a bank divided into four quarters (Q0-Q3)
Figure 11:
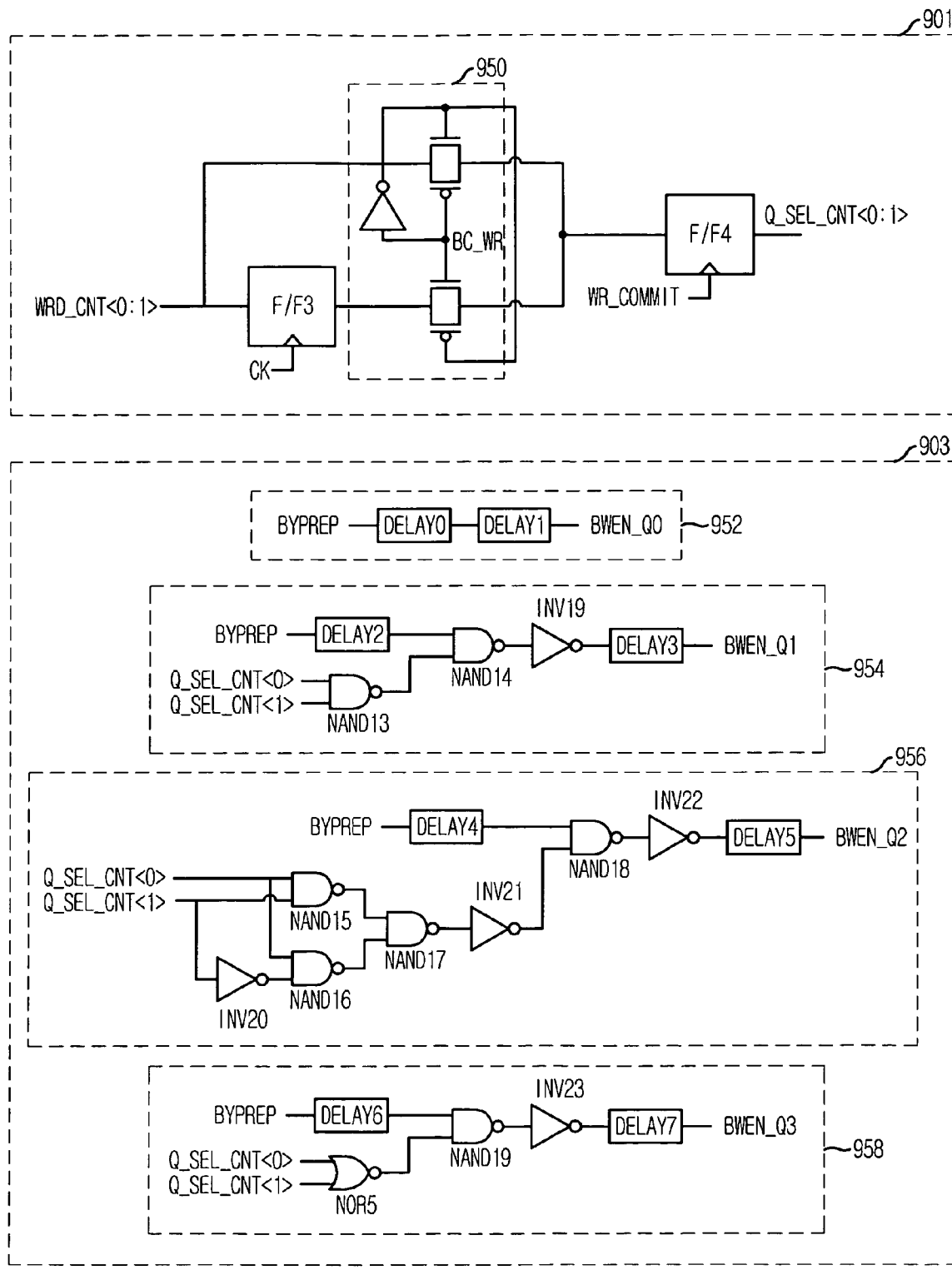
FIG. 11 is a circuit diagram of a write enable signal generator of FIG. 4.

FIG. 10 is a block diagram of a bank that includes a plurality of cell arrays and is divided into four quarters (Q0-Q3). FIG. 11 is a circuit diagram of the write enable signal generator 307 of FIG. 4.

Referring to FIGS. 10 and 11, the write enable signal generator 307 includes a quarter select signal generating unit 901 for generating a quarter select signal, and a quarter write enable signal generating unit 903 for receiving the quarter select signal to generate a write enable signal.

More specifically, the quarter select signal generating unit 901 includes a first flip-flop F/F3, a switch 950, and a second flip-flip F/F4. The first flip-flop F/F3 receives the clock CK as a control signal and divides the divided signals WRD_CNT<0:1> outputted from the write counter 301. The switch 950 selectively transfers the divided signals WRD_CNT<0: 1> or an output signal of the first flip-flop F/F3 in response to the write command BC_WR. The second flip-flop F/F4 receives the write flag signal WR_COMMIT as a control signal and divides an output signal of the switch 950 to output quarter select signals Q_SEL_CNT<0:1>.

The quarter write enable signal generating unit 903 includes a first quarter write enable signal generator 952, a second quarter write enable signal generator 954, a third quarter write enable signal generator 956, and a fourth quarter write enable signal generator 958.

The first quarter write enable signal generator 952 outputs a first quarter write enable signal BWEN_Q0 by delaying a BYPREP signal using first and second delays DELAY0 and DELAY1. The BYPREP signal is a signal generated by delaying the write flag signal WR_COMMIT and adjusting its pulse width.

In the second quarter write enable signal generator 954, a third delay DELAY2 delays the BYPREP signal, and a first NAND gate NAND13 is configured to receive first and second quarter select signals Q_SEL_CNT<0:1>. A second NAND gate NAND14 is configured to receive an output signal of the first NAND gate NAND13 and an output signal of the third delay DELAY2. A first inverter INV19 inverts an output signal of the second NAND gate NAND14, and a fourth delay DELAY3 delays an output signal of the first inverter INV19 to output a second quarter write enable signal BWEN_Q1.

In the third quarter write enable signal generator 956, a third NAND gate NAND15 is configured to receive the first and second quarter select signals Q_SEL_CNT<0:1>, and a second inverter INV20 inverts the second quarter select signal Q_SEL_CNT<1>. A fourth NAND gate NAND16 is configured to receive the first quarter select signal Q_SEL_CNT<0> and an output signal of the second inverter INV20. A fifth NAND gate NAND17 is configured to receive an output signal of the third NAND gate NAND15 and an output signal of the fourth NAND gate NAND16. A third inverter INV21 inverts an output signal of the fifth NAND gate NAND17, and a fifth delay DELAY4 delays the BYPREP signal. A sixth NAND gate NAND18 is configured to receive an output signal of the fifth delay DELAY4 and an output signal of the third inverter INV21. A fourth inverter INV22 inverts an output signal of the sixth NAND gate NAND18, and a sixth delay DELAY5 delays an output signal of the fourth inverter INV22 to output a third quarter write enable signal BWEN_Q2.

The fourth quarter write enable signal generator 958, a seventh delay DELAY6 delays the BYPREP signal, and a NOR gate NOR5 is configured to receive the first and second quarter select signals Q_SEL_CNT<0:1>. A seventh NAND gate NAND19 is configured to receive an output signal of the seventh delay DELAY6 and an output signal of the NOR gate NOR5. A fifth inverter INV23 inverts an output signal of the seventh NAND gate NAND19. An eighth delay DELAY7 delays an output signal of the fifth inverter INV23 to output a fourth quarter write enable signal BWEN_Q3.

The first to eighth delays DELAY0 to DELAY7 must have delay time allowing the first to fourth quarter write enable signals BWEN_Q0 to BWEN_Q3 to be generated at the same time.

Upon operation, when data are written to one of the quarters Q0 to Q3, 16-bit write data inputted for one clock CK are stored. For example, if the write flag signal WR_COMMIT is generated when the count value of the write counter (which is generated by WRD_CNT<0:1>) is "2", it means that the write data are applied two times after the write command BC_WR is inputted. Thus, only the first and second quarter write enable signals BWEN_Q0 and BWEN_Q1 are generated.

When the write command BC_WR is interrupted by another command, the write counter is reset immediately when the write command BC_WR is applied. Therefore, the count value delayed by half clock is stored as the count value when the write flag signal WR_COMMIT is generated, and the write operation is carried out.

As described above, the multi-port memory device in accordance with the present invention can perform the normal write operation and the interrupt write operation by providing the counter that operates only at the period in which the write data input flag signal BC_WR_STB is logic level HIGH.

It is apparent to those skilled in the art that the write counter, the write data register, the write flag signal generator, and the write enable signal generator can be implemented with various logic circuits.

The multi-port memory device in accordance with the present invention can be connected to a plurality of external devices and easily allocate more memory space to a device having high memory utilization rate, thereby enhancing the memory utilization efficiency.

Further, the multi-port memory device in accordance with the present invention can support the normal write operation, the "write burst with preemption" operation, and the interrupt write operation, thereby securing the operation flexibility.

The present application contains subject matter related to Korean patent application Nos. 2005-90866 & 2006-79677, filed in the Korean Intellectual Property Office on Sep. 28, 2005 & Aug. 23, 2006, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A multi-port memory device having a plurality of ports which are connected to different external devices and perform a serial data communication independently and a plurality of banks each having a plurality of cell arrays, the multi-port memory device comprising:
   a write counter for increasing a counting number whenever write data are applied to the banks through the ports;
   a write data register for temporarily storing the write data according to the count number;
   a write flag signal generator for generating a flag signal for writing the temporarily stored write data to the banks; and
   a write enable signal generator for generating a write enable signal in response to the flag signal to write the temporarily stored write data to the banks.

2. The multi-port memory device of claim 1, wherein each of the banks is divided into four parts.

3. The multi-port memory device of claim 2, wherein the ports performs a parallel communication with the banks.

4. The multi-port memory device of claim 3, wherein the write counter includes:
   a first toggle flip-flop for dividing an inputted control signal by two;
   a second toggle flip-flop for dividing an output signal of the first toggle flip-flop by two;
   a first logic circuit for outputting a control signal of the first toggle flip-flop; and
   a second logic circuit for outputting reset signals of the first and second toggle flip-flops.

5. The multi-port memory device of claim 4, wherein the first logic circuit includes a first NAND gate configured to receive a write data input flag signal which is activated after a write command is inputted and having an active period until the write data are written to the memory cells, and a delayed clock signal which is generated by delaying an external clock by a predetermined time.

6. The multi-port memory device of claim 4, wherein the second logic circuit is a first OR gate configured to receive a write command and a reset signal.

7. The multi-port memory device of claim 4, wherein the write data register includes:
   a plurality of decoders for determining a register for temporarily storing the write data according to an output signal of the write counter; and
   a plurality of registers, each for temporarily storing the write data according to a corresponding one of output signals of the decoders.

8. The multi-port memory device of claim 7, wherein the decoders include:
   a first decoder for generating a first decoding signal and storing a first write data consisting of a first set of 16 bits in the first register;
   a second decoder for generating a second decoding signal and storing a second write data consisting of a second set of 16 bits in the second register;
   a third decoder for generating a third decoding signal and storing a third write data consisting of a third set of 16 bits in the third register; and
   a fourth decoder for generating a fourth decoding signal and storing a third write data consisting of a fourth set of 16 bits in the fourth register.

9. The multi-port memory device of claim 8, wherein the first decoder includes:
   a first NAND gate configured to receive output signals of the first and second toggle flip-flop and the write data input flag signal;
   a first inverter for inverting an output signal of the first NAND gate;
   a second NAND gate configured to receive an output signal of the first inverter and an external clock; and
   a second inverter for inverting an output signal of the second NAND gate to output a first decoding signal.

10. The multi-port memory device of claim 8, wherein the second decoder includes:
   a first inverter for inverting an output signal of the first toggle flip-flop;
   a first NAND gate configured to an output signal of the first inverter, an output signal of the second toggle flip-flop, and the write data input flag signal;
   a second inverter for inverting an output signal of the first NAND gate;
   a second NAND gate configured to receive an output signal of the second inverter and an external clock; and
   a third inverter for inverting an output signal of the second NAND gate to output a second decoding signal.

11. The multi-port memory device of claim 8, wherein the third decoder includes:
   a first inverter for inverting an output signal of the second toggle flip-flop;
   a first NAND gate configured to receive an output signal of the first inverter, an output signal of the first toggle flip-flop, and the write data input flag signal;
   a second inverter for inverting an output signal of the first NAND gate;
   a seventh NAND gate configured to receive an output signal of the second inverter and an external clock; and
   a third inverter for inverting an output signal of the second NAND gate to output a third decoding signal.

12. The multi-port memory device of claim 8, wherein the fourth decoder includes:
a first inverter for inverting an output signal of the first toggle flip-flop;
a second inverter for inverting an output signal of the second toggle flip-flop;
a first NAND gate configured to receive an output signal of the first inverter, an output signal of the second inverter, and the write data input flag signal;
a third inverter for inverting an output signal of the first NAND gate;
a second NAND gate configured to receive an output signal of the third inverter and an external clock; and
a fourth inverter for inverting an output signal of the second NAND gate to output a fourth decoding signal.

13. The multi-port memory device of claim 8, wherein the first to fourth registers includes a plurality of transmission gates for transferring the write data to a plurality of latch circuits of the respective registers according to the first to fourth decoding signals.

14. The multi-port memory device of claim 7, wherein the write flag signal generator includes:
a control circuit for generating a first signal for controlling a write flag signal to generate a driving signal of a YI transistor, which connects a bit line to a segment I/O line, and a write driver enable signal for writing the write data to the banks; and
a write flag signal generating circuit for receiving output signals of the first and second toggle flip-flops, and an interrupt command to generate the write flag signal under the control of the first signal.

15. The multi-port memory device of claim 14, wherein the control circuit includes:
a first delay unit for delaying a write command;
a first inverter for inverting an output signal of the first delay unit;
an OR gate configured to receive an output signal of the first inverter and the write command;
a PMOS transistor connected to a power supply voltage and having a gate receiving an output signal of the OR gate;
a second delay unit for delaying a reset signal for resetting an output signal of the control circuit;
a second inverter for inverting an output signal of the second delay unit;
a NOR gate configured to receive an output signal of the second inverter and the reset signal;
an NMOS transistor connected to a ground voltage and having a gate receiving an output signal of the NOR gate;
a latch for latching an output signal of the PMOS transistor and the NMOS transistor; and
a third inverter for inverting an output signal of the latch to output the first signal.

16. The multi-port memory device of claim 14, wherein the write flag signal generating circuit includes:
a first NOR gate configured to receive the output signals of the first and second toggle flip-flops;
a first NAND gate configured to receive an output signal of the first NOR gate and the write data input flag signal;
a first inverter for inverting an output signal of the first NAND gate;
a second NOR gate configured to receive an output signal of the first inverter and an interrupt command;
a second inverter for inverting an output signal of the second NOR gate;
a second NAND gate configured to receive an output signal of the second inverter and the first signal outputted from the control circuit;
a third inverter for inverting an output signal of the second NAND gate to output a reset signal for deactivating the first signal;
a third NAND gate configured to receive the first signal and a write command; and
a fourth NAND gate configured to receive the output signal of the second NAND gate and an output signal of the third NAND gate to output the write flag signal.

17. The multi-port memory device of claim 14, wherein the write enable signal generator includes:
a quarter select signal generating unit for generating a quarter select signal; and
a quarter write enable signal generating unit for receiving the quarter select signal to generate the write enable signal.

18. The multi-port memory device of claim 17, wherein the quarter select signal generating unit includes:
a third flip-flop for receiving an external clock as a control signal and dividing the output signals of the first and second toggle flip-flops;
a switch for selectively transferring the output signals of the first and second toggle flip-flops and an output signal of the third flip-flop according to the write command; and
a fourth flip-flop for receiving the first signal as a control signal and dividing an output signal of the switch to output the quarter select signal.

19. The multi-port memory device of claim 17, wherein the quarter write enable signal generating unit includes:
a first quarter write enable signal generator for outputting a first quarter write enable signal to a first quarter of one of the banks;
a second quarter write enable signal generator for outputting a second quarter write enable signal to a second quarter of one of the banks;
a third quarter write enable signal generator for outputting a third quarter write enable signal to a third quarter of one of the banks; and
a fourth quarter write enable signal generator for outputting a fourth quarter write enable signal to a fourth quarter of one of the banks.

20. The multi-port memory device of claim 19, wherein the first quarter write enable signal generator includes a first delay unit for delaying an adjust signal to output the first quarter write enable signal, the adjust signal being generated by dividing the first signal and adjusting a pulse width thereof.

21. The multi-port memory device of claim 20, wherein the second quarter write enable signal generator includes:
a second delay unit for delaying the adjust signal;
a first NAND gate configured to receive the first and second quarter select signals;
a second NAND gate configured to receive an output signal of the first NAND gate and an output signal of the second delay unit;
an inverter for inverting an output signal of the second NAND gate; and
a third delay unit for delaying an output signal of the inverter to output the second quarter write enable signal.

22. The multi-port memory device of claim 20, wherein the third quarter write enable signal generator includes:
a first NAND gate configured to receive the first and second quarter select signals;
a first inverter for inverting the second quarter select signal;

a second NAND gate configured to receive the first quarter select signal and an output signal of the first inverter;

a third NAND gate configured to receive an output signal of the first NAND gate and an output signal of the second NAND gate;

a second inverter for inverting an output signal of the third NAND gate;

a second delay unit for delaying the adjust signal;

a fourth NAND gate configured to receive an output signal of the second delay unit and an output signal of the second inverter;

a third inverter for inverting an output signal of the fourth NAND gate; and a third delay unit for delaying an output signal of the third inverter to output the third quarter write enable signal.

23. The multi-port memory device of claim 20, wherein the fourth quarter write enable signal generator includes:

a second delay unit for delaying the adjust signal;

a NOR gate configured to receive the first and second quarter select signals;

a NAND gate configured to receive an output signal of the second delay unit and an output signal of the NOR gate;

an inverter for inverting an output signal of the NAND gate; and a third delay unit for delaying an output signal of the inverter to output the fourth quarter write enable signal.

* * * * *

UNITED STATES PATENT AND TRADEMARK OFFICE
CERTIFICATE OF CORRECTION

PATENT NO. : 7,523,270 B2  Page 1 of 1
APPLICATION NO. : 11/529451
DATED : April 21, 2009
INVENTOR(S) : Jae-Il Kim It is certified that error appears in the above-identified patent and that said Letters Patent is hereby corrected as shown below:

In Column 2, line 4, please delete "Fin" and insert -- in --.

Signed and Sealed this

Thirtieth Day of June, 2009

JOHN DOLL
*Acting Director of the United States Patent and Trademark Office*